United States Patent
Brooks

(10) Patent No.: US 6,940,434 B2
(45) Date of Patent: Sep. 6, 2005

(54) METHODS AND SYSTEMS FOR DIGITAL DITHER

(75) Inventor: Todd Lee Brooks, Laguna Beach, CA (US)

(73) Assignee: Broadcom Corporation, Irvine, CA (US)

(*) Notice: Subject to any disclaimer, the term of this patent is extended or adjusted under 35 U.S.C. 154(b) by 138 days.

(21) Appl. No.: 10/861,377

(22) Filed: Jun. 7, 2004

(65) Prior Publication Data

US 2004/0233084 A1 Nov. 25, 2004

Related U.S. Application Data

(63) Continuation of application No. 10/372,229, filed on Feb. 25, 2003, now Pat. No. 6,774,830, which is a continuation of application No. 09/949,816, filed on Sep. 12, 2001, now Pat. No. 6,577,257.
(60) Provisional application No. 60/232,173, filed on Sep. 11, 2000, and provisional application No. 60/232,176, filed on Sep. 11, 2000.

(51) Int. Cl.[7] ............................................. H03M 1/20
(52) U.S. Cl. ..................... 341/131; 341/155; 341/143
(58) Field of Search ................................. 341/131, 155, 341/143

(56) References Cited

U.S. PATENT DOCUMENTS

| | | | |
|---|---|---|---|
| 4,914,439 A | 4/1990 | Nakahashi et al. ......... | 341/131 |
| 4,937,576 A | 6/1990 | Yoshio et al. ............. | 341/131 |
| 4,968,987 A | 11/1990 | Naka et al. ................ | 341/143 |
| 5,055,846 A | 10/1991 | Welland .................... | 341/155 |
| 5,329,282 A | 7/1994 | Jackson .................... | 341/143 |
| 5,404,142 A | 4/1995 | Adams et al. ............. | 341/144 |
| 5,406,283 A | 4/1995 | Leung ...................... | 341/143 |
| 5,684,482 A | 11/1997 | Galton ...................... | 341/144 |
| 5,835,038 A | 11/1998 | Nakao et al. .............. | 341/131 |
| 5,986,512 A | 11/1999 | Eriksson .................... | 331/16 |
| 6,577,257 B2 | 6/2003 | Brooks ...................... | 341/131 |

OTHER PUBLICATIONS

Delta–Sigma Data Converters Theory, Design, and Simulation, (Steven R. Norsworthy, et al. ed., IEEE Press Marketing) (1997).
Brooks, Todd L. et al., U.S. Appl. No. 09/949,807, filed on Sep. 12, 2001, titled "Method and Apparatus for Mismatched Shaping of an Oversampled Converter,".
Brooks, Todd L. et al., U.S. Appl. No. 09/949,815, filed Sep. 12, 2001, titled "Method and Apparatus for Mismatched Shaping of an Oversampled Converter,".

Primary Examiner—Peguy JeanPierre
(74) Attorney, Agent, or Firm—Sterne, Kessler, Goldstein & Fox P.L.L.C.

(57) ABSTRACT

Methods and systems for applying digital dither includes methods and systems for applying digital dither in data converters, such as, for example, delta-sigma data converters. In an embodiment, an analog signal from a first path of a delta-sigma modulator is quantized to an m-bit digital signal and an n-bit dithered digital feedback signal is generated from at least a portion of the m-bit digital signal. The n-bit dithered digital feedback signal is converted to an analog feedback signal and fed back to a second path of the delta-sigma modulator. In an embodiment, the n-bit dithered digital feedback signal is generated by selecting one of a plurality of sets of n-bits from the m-bit digital signal depending upon a state of a dither control signal. The dither control signal can alternate between a plurality of states or pseudo-randomly switch between a plurality of states. In an embodiment, the m-bit digital signal is an m-bit thermometer code signal and the n-bit dithered digital feedback signal is generated by selecting between bits 0 through m-2 and bits 1 through m-1 of the m-bit digital signal. In an alternative embodiment, the m-bit digital signal is an m-bit thermometer code signal and the n-bit dithered digital feedback signal is generated by selecting between even and odd bits of the m-bit digital signal.

14 Claims, 21 Drawing Sheets

Analog multi-bit delta-sigma modulator

Example Digital Dither Module Operation

Analog multi-bit delta-sigma modulator

Digital Dither Module Operation

METHODS AND SYSTEMS FOR DIGITAL DITHER

CROSS REFERENCE TO RELATED APPLICATIONS

This application is a continuation of U.S. application Ser. No. 10/372,229, titled, "Methods and Systems for Digital Dither," filed Feb. 25, 2003 now U.S. Pat. No. 6,774,830, which claimed priority to U.S. application Ser. No. 09/949,816, filed Sep. 12, 2001, entitled "Methods and Systems for Digital Dither," now U.S. Pat. No. 6,577,257, which claimed priority to U.S. Provisional Application No. 60/232,173, filed Sep. 11, 2000, entitled "Digital Dither Technique to Increase Dynamic Range in an Analog Multi-Bit Delta Sigma Modulator," and U.S. Provisional Application No. 60/232,176, filed Sep. 11, 2000, entitled "Digital Dither Technique to Increase Dynamic Range in an Analog Multi-Bit Delta Sigma Modulator in a Gateway with Voice," all of which are incorporated herein by reference in their entireties.

BACKGROUND OF THE INVENTION

1. Field of the Invention

The invention relates to data converters and, more particularly, to multi-bit analog-to-digital data converters such as delta-sigma modulators and, more particularly, to digital dither in data converters.

2. Background Art

A common limitation in the performance of audio analog delta-sigma modulators is quantization noise, including idle-channel noise. With small input amplitudes, performance is typically degraded by limit cycles in the modulator loop. The quantization noise spectra typically includes high-powered spectral tones at frequencies close to fs/2, where fs is a sampling rate of the modulator.

There are two common causes for these tones to fold into the signal passband and degrade the performance of the analog delta-sigma modulator. One cause is due to interfering digital signals which couple onto the reference voltage for the delta-sigma modulator. When these interfering digital signals couple onto the reference voltage they intermodulate with the high-powered spectral tones and cause them to fold into the passband. For this reason analog delta-sigma modulators are sensitive to coupled digital noise. The second common cause of for the idle tones to fold into the signal passband is due to nonlinearities in the analog signal processing path in the analog delta-sigma modulator. In the presence of these nonlinearities the idle tones typically intermodulate with each other, causing them to fold into the signal passband. This results in audible tones that are often detectable by the human ear. Accordingly, it is desirable to reduce the amplitude of the idle-tones near fs/2. Quantization noise is described in "Delta-Sigma Data Converters, Theory, Design, and Simulation," edited by Norsworthy et al., IEEE Press, 1997, ISBN 0-7803-10454, incorporated herein by reference in its entirety.

A conventional solution to quantization noise in an analog delta-sigma modulator is to apply analog dither, or noise, in the modulator loop. For example, U.S. Pat. No. 5,055,846, entitled "Method of Tone Avoidance in Delta-Sigma Converters," incorporated herein by reference in its entirety, appears to teach applying analog dither to an input of a quantizer and reducing the input signal to a very low level to reduce the signal-to-noise ratio of the signal. The resulting noisy input signal is applied to the input of a comparator in a single-bit analog delta-sigma modulator loop. The increased noise level in this signal acts as analog dither and helps to break up the spectral tones in the delta-sigma modulator.

The technique utilized in U.S. Pat. No. 5,055,846 is not suitable for use in a multi-bit analog delta-sigma modulator loop because performance is limited by errors in the thresholds of the quantizer. In a single-bit delta-sigma modulator a single comparator is used with the threshold set equal to zero. In this case comparator offset does not effect performance. In a multi-bit delta-sigma modulator the quantizer thresholds should be reduced in proportion to the reduction of signal amplitude. The quantizer thresholds should be placed very close together if the signal preceding the quantizer is attenuated. Inaccuracies in the quantizer thresholds cause an increase in the quantization error. This degrades the modulator performance.

What is needed are methods and systems for applying dither in analog-to-digital data converters, such as multi-bit delta-sigma modulators.

BRIEF SUMMARY OF THE INVENTION

The present invention is directed to methods and systems for applying digital dither. In an embodiment, digital dither is applied in data converters such as, without limitation, delta-sigma modulators. For example, in a delta-sigma modulator that receives an analog input signal and includes a first path including a quantizer that outputs an m-level code, an n-level dithered digital feedback signal is generated from the m-level code. In an embodiment, m is greater than one. In an alternative embodiment, m is equal to 1. In an embodiment, n is less than m. In an alternative embodiment, n is greater than m. The n-level dithered digital feedback signal is converted to an analog feedback signal and fed back to a second path of the delta-sigma modulator.

In an embodiment, the dithered digital feedback signal is generated from one or more portions of the m-level code. For example, in an embodiment, the m-level code is an m-bit signal, such as a thermometer coded signal, and the dithered digital feedback signal is generated by selecting between sub-sets of bits from the m-bit code. In an example embodiment, n equals m−1, a first sub-set of n-bits includes bits zero through m−2 of the m-bit signal, and a second sub-set of bits includes bits 1 through m-1 of the m-bit signal. In another example embodiment, m is an even integer, n equals m divided by 2, a first sub-set of n-bits includes even bits of the m-bit signal, and a second sub-set of bits includes odd bits of the m-bit signal.

In an embodiment, the dithered digital feedback signal is generated in inverse proportion to an amplitude of the input analog signal and/or the m-level code.

Further features and advantages of the invention, as well as the structure and operation of various embodiments of the invention, are described in detail below with reference to the accompanying drawings. The drawing in which an element first appears is typically indicated by the leftmost digit(s) in the corresponding reference number.

It is noted that the invention is not limited to the specific embodiments described herein. Such embodiments are presented herein for illustrative purposes only. Additional embodiments will be apparent to persons skilled in the relevant art(s) based on the teachings contained herein.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The present invention will be described with reference to the accompanying drawings wherein.

DETAILED DESCRIPTION OF THE INVENTION

Table of Contents

I. Introduction
II. High Level Description
III. Example Embodiments
IV. Conclusions

I. Introduction

The invention is directed to data converters and, more particularly, to analog-to-digital delta-sigma modulators and, more particularly, to digital dither in data converters.

In an embodiment, the present invention is implemented as a dither digital-to-analog converter ("dither DAC"). In an embodiment, a dither DAC is implemented in an analog-to-digital delta-sigma modulator, wherein the dither DAC produces an analog feedback signal in the analog-to-digital delta-sigma modulator, and wherein the digital dither in the dither DAC breaks up the limit cycles in the delta-sigma modulator. These limit cycles typically cause the large amplitude idle tones which commonly occur near one-half the sample rate of the delta-sigma modulator. Accordingly it is desirable to add dither to the analog sigma-delta modulator. The invention is not, however, limited to implementation in analog-to-digital delta-sigma modulators. Based on the description herein, one skilled in the relevant art(s) will understand that a dither DAC in accordance with the invention can be implemented in other systems as well.

In an embodiment, a dither DAC in accordance with the invention is implemented in an multi-bit delta-sigma modulator. There are a number of performance advantages to multi-bit delta-sigma implementations as compared to single-bit delta-sigma implementations. These advantages include reduced quantization noise, increased dynamic range performance, and/or increased signal bandwidth, depending on design considerations.

In an embodiment, the present invention adaptively dithers in inverse proportion to an input signal amplitude.

In an embodiment, the present invention is implemented digitally and thus substantially avoids impacting analog circuit design and analog signal paths.

II. High Level Description

Figure 1:
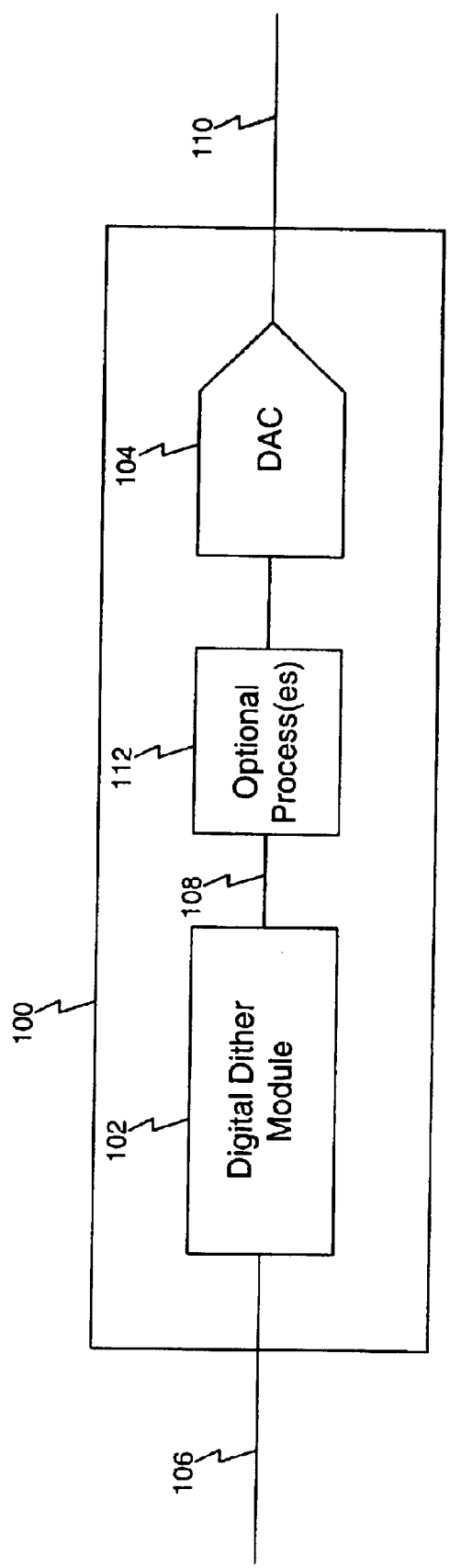
FIG. 1 is a high level block diagram of a dither digital-to-analog converter ("DAC"), in accordance with the present invention.

FIG. 1 illustrates a high level block diagram of an example dither DAC 100, including a digital dither module 102 and a digital-to-analog converter ("DAC") 104. The digital dither module 102 receives a digital signal 106, adds dither to the digital signal 106, and outputs a dithered digital signal 108. The DAC 104 receives the dithered digital signal 108, converts it to an analog signal 110.

In an embodiment, the digital dither module 102 introduces digital dither by adding a pseudo-random digital value to the digital signal 106. Alternatively, or additionally, digital dither is added by directly manipulating bits of the digital signal 106. In an embodiment, digital dither is added in inverse proportion to the magnitude of the digital signal 106.

In an embodiment, one or more optional processes are performed within an optional process(es) module 112. The optional process(es) module 112 can represent, for example, mismatch shaping, filtering, integration, one or more feedback loops, and/or one or more inputs to and/or outputs from one or more feedback loops. Alternatively, or additionally, one or more optional processes are performed within DAC 104. For ease of illustration, the optional process(es) module 112 is not shown in subsequent drawing figures. It is to be understood, however, that one or more optional processes can be implemented within the dither DAC 100 illustrated in subsequent drawing figures.

A. Example Environment: Delta-Sigma Modulators

Figure 2:
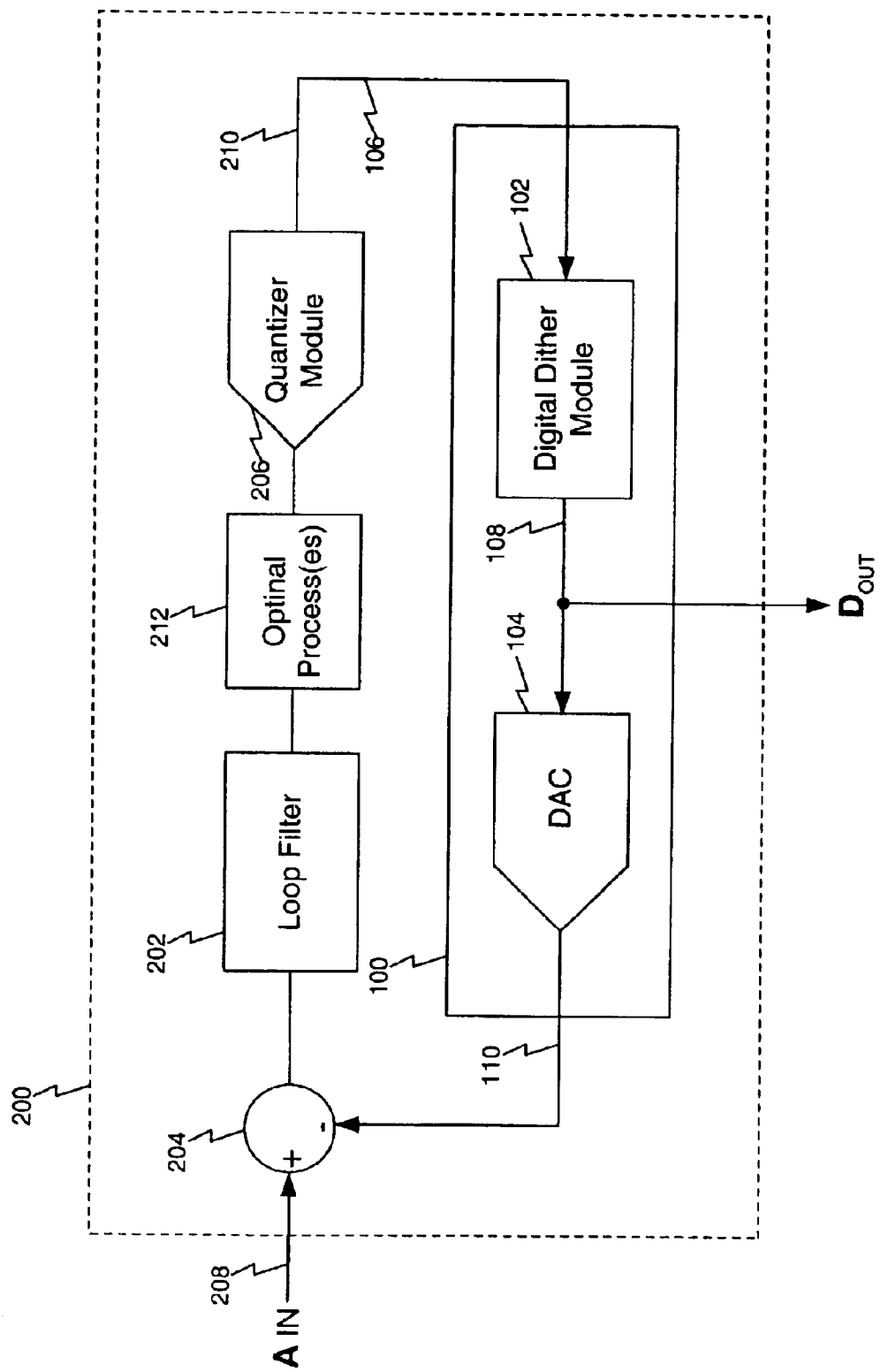
FIG. 2 is a block diagram of the dither DAC of FIG. 1 implemented in an m-level delta-sigma modulator, in accordance with an aspect of the present invention.

FIG. 2 is a high-level block diagram of a delta-sigma modulator 200, including a loop filter module 202, a differencer 204, and a quantizer 206. The delta-sigma modulator 200 receives an analog signal 208 and outputs a digital signal 210, in a manner well known in the relevant art(s).

In an embodiment, one or more optional processes are performed in an optional process(es) module 212. The optional process(es) module 212 can represent, for example, filtering, integration, one or more feedback loops, and/or one or more inputs to and/or outputs from one or more feedback loops. Operation of such processes are well known in the relevant art(s). For ease of illustration, the optional process module 212 is not shown in subsequent drawing figures. It is to be understood, however, that one or more optional processes can be implemented within the delta-sigma modulator 200 illustrated in subsequent drawing figures.

The delta-sigma modulator 200 further includes the dither DAC 100 in a feedback loop. In this embodiment, the digital signal 106 is a digital feedback signal, the dithered digital signal 108 is a dithered digital feedback signal 108, and the analog signal 110 is an analog feedback signal 110. The analog feedback signal 110 is subtracted from the analog input signal 208 by the differencer 204. The dither DAC 100 uses digital dither to break up the limit cycles in the delta-sigma modulator. The digital dither in dither DAC 100 breaks up the limit cycles in delta-sigma modulator 200. These limit cycles typically cause the large amplitude idle tones which commonly occur near one-half the sample rate of delta-sigma modulator 200.

In an embodiment, the digital feedback signal 106 is substantially identical to the digital signal 210. In an alternative embodiment, the digital feedback signal 106 includes a portion of the digital signal 210. In another alternative embodiment, the digital feedback signal 106 is substantially different than the digital signal 210.

In an embodiment, one or more additional signal processing functions are performed on the digital feedback signal 106 before and/or after insertion of digital dither by the digital dither module 102. For example, where the digital signal 210 is a multi-level code, the digital signal 210 can be converted to a thermometer code digital signal 106. In an embodiment, one or more functions described herein as performed by the digital dither module 102, are performed within the quantizer module 206.

1. Multi-Bit Environments

In an embodiment, the present invention operates in a multi-level code environment, in which multiple amplitude levels are digitally coded, or represented. The multiple levels of code can be represented in binary form or in a variety of other forms, including, without limitation, density code and thermometer code. In an embodiment, multiple levels of code are represented by multiple bits. In such an embodiment, the quantizer module 206 is and/or the DAC 104 are multi-bit devices that are designed to handle multiple levels of code. In an embodiment, multi-level bits are thermometer coded bits. In an alterative embodiment, multi-level bits are density coded bits.

In an embodiment, a coder is used to convert digital words of a digital signal from one digital format to another digital format. For example, as mentioned above, a coder may convert a binary coded signal to a thermometer coded signal. Such an exemplary coder is referred to as a binary-to-thermometer coder. An n–1 bit thermometer code is required to represent n possible binary values, as will be clear from Table 1 below. The first row of Table 1 includes the five possible values of a binary coded word between binary "000" (decimal 0) and binary "100" (decimal 5). Thus, as shown in Table 1 below, four bits are required for the thermometer codes in the second column.

A thermometer code is a type of density code. A "density code" refers to a word in which the density of the word (not the specific order) indicates the value of the signal (thus, a binary coded word is not a density coded word). More specifically, the "density" of a word specifies how many of the bits in the word are a specific bit or logic value (i.e., logic one). Four bit words will be used to explain this concept. A four bit word can have a density of zero, ¼th, ½, ¾th or one. More specifically, the four bit word "0000" has a density of 0/4th (i.e., zero). The four bit words "0001", "0010", "0100" and "1000", each have a density of ¼th. The four bit words "0011", "0110", "1100", "1001", "1010" and "0101", each have a density of 2/4th (i.e., ½). The four bit words "1110", "1101", "1011" and "0111", each have a density of ¾th. The four bit word "1111" has a density of 4/4th (i.e., one).

A specific type of density code is a "thermometer code". A thermometer coded is a density code having a specific order (but it is still the density, not the order that specifies its value). The term "thermometer" code is used because when visualizing the code it increases in value much like a thermometer increases in value. The second column of Table 1 illustrates the thermometer code words that correspond to the binary code words in the first column. That is, the second column represents the output of a binary-to-thermometer coder.

The third column of Table 1 specifies the density of the thermometer codes in the second column. The fourth (i.e., last) column of Table 1 includes density codes that can be generated from the thermometer codes in the third column, e.g., by shuffling the thermometer codes using a mismatch shaping network.

TABLE 1

| Binary Input (e.g., to a Binary-to-Thermom eter Coder) | Thermometer Output (e.g., from a Binary-to-Thermomet er Coder) | Density of Thermometer Output | Possible Density Codes that Can be Produced by Shuffling the Thermometer Code (i.e., Shuffled Density Codes) |
|---|---|---|---|
| 000 | 0000 | 0 | 0000 |
| 001 | 0001 | 1/4th | 0001, 0010, 0100, 1000 |
| 010 | 0011 | 2/4th | 0011, 0110, 1100, 1010, 0101, 1001 |
| 011 | 0111 | 3/4th | 0111, 1011, 1101, 1110 |
| 100 | 1111 | 4/4th | 1111 |

The above discussion has been provided to help the reader under stand the terms "coder", "thermometer code", "density code" and "shuffled code." A binary-to-thermometer coder is only one example of a coder that can be used with the present invention. However, the present invention is not meant to be limited to this type of coder.

The present invention is described herein with examples that utilize, among other terms, the terms m-level codes, m-bits, n-level codes, n-bits, and thermometer codes. The invention is not, however, limited to the these example implementations. Based on the description herein, one skilled in the relevant art(s) will understand that the invention can be implemented with single level codes and/or other multi-level codes. Thus, unless otherwise specified herein, the terms level, bit, and code are used interchangeably.

Figure 3:
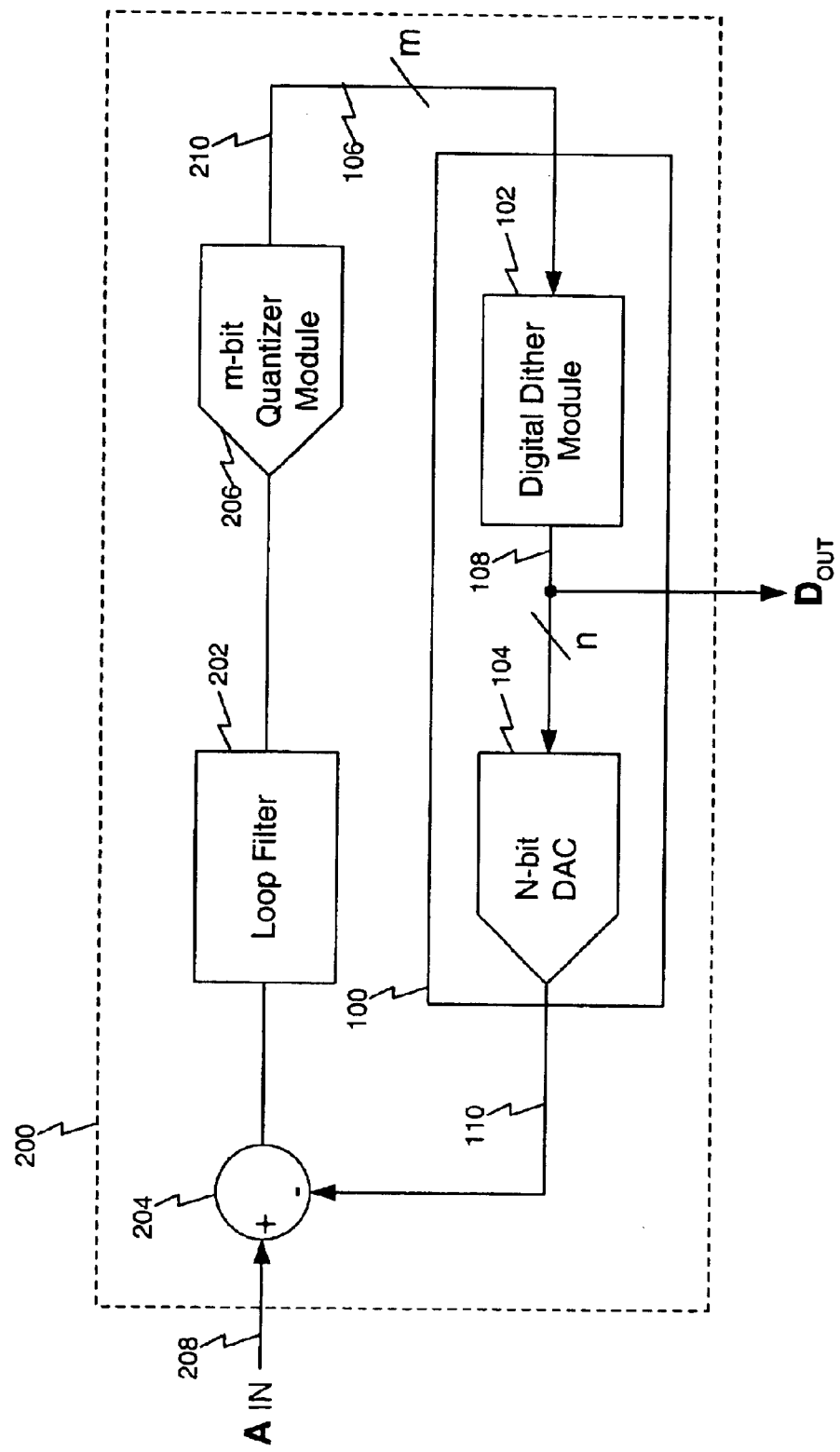
FIG. 3 is a block diagram of an example embodiment of the m-level delta-sigma modulator illustrated in FIG. 2, wherein the digital dither module receives an m-level code and outputs an n-level dithered digital feedback signal.

FIG. 3 illustrates a block diagram of the delta-sigma modulator 200, wherein the quantizer module 206 is an m-bit quantizer module 206 and the DAC 104 is an n-bit DAC 104, and n and m are integers (1, 2, 3, . . . ). Generally, n is not equal to m. In an embodiment, m is greater than n. Alternatively, m is less than n.

In the embodiment of FIG. 3, the digital signal 210 is referred to as an m-bit digital signal 210 and the dithered digital feedback signal 108 is referred to as an n-bit dithered digital feedback signal 108. When m is greater than 1, the m-bit digital signal 210 is a multi-level signal. When n is greater than 1, the n-bit dithered digital feedback signal 108 is a multi-level signal.

In an embodiment, the quantizer module 206 is implemented as a flash analog-to-digital ("ADC") converter that outputs the m-bit digital signal 210 as a thermometer code.

In an embodiment, the digital dither module 102 outputs the dithered digital feedback signal 108 as a thermometer code. In an embodiment, the digital dither module 102 outputs the dithered digital feedback signal 108 as a thermometer code and the DAC 104 is implemented as a unit-element DAC, which is convenient to use with thermometer codes.

In an embodiment, m is greater than n, the quantizer module 206 outputs the m-bit digital feedback signal 210 as a thermometer code, and the n-bit dithered digital feedback signal 108 is a sub-set of bits from the m-bit digital signal 210. In this embodiment, the quantizer module 206 can include extra thresholds so that the m-bit digital signal 210 has a wider range of digital signals than required in the dither DAC 100 feedback loop. In this embodiment, the digital dither module 102 can be designed to select between two or more sub-sets of bits of the m-bit digital signal 210. Example implementations for selecting among sub-sets of bits from the m-bit digital signal 210 are provided in sections below.

Alternatively, m is less than n. For example, in an embodiment, m equals 1. Example implementations for m less than n are provided below.

III. Example Embodiments

Figure 4:
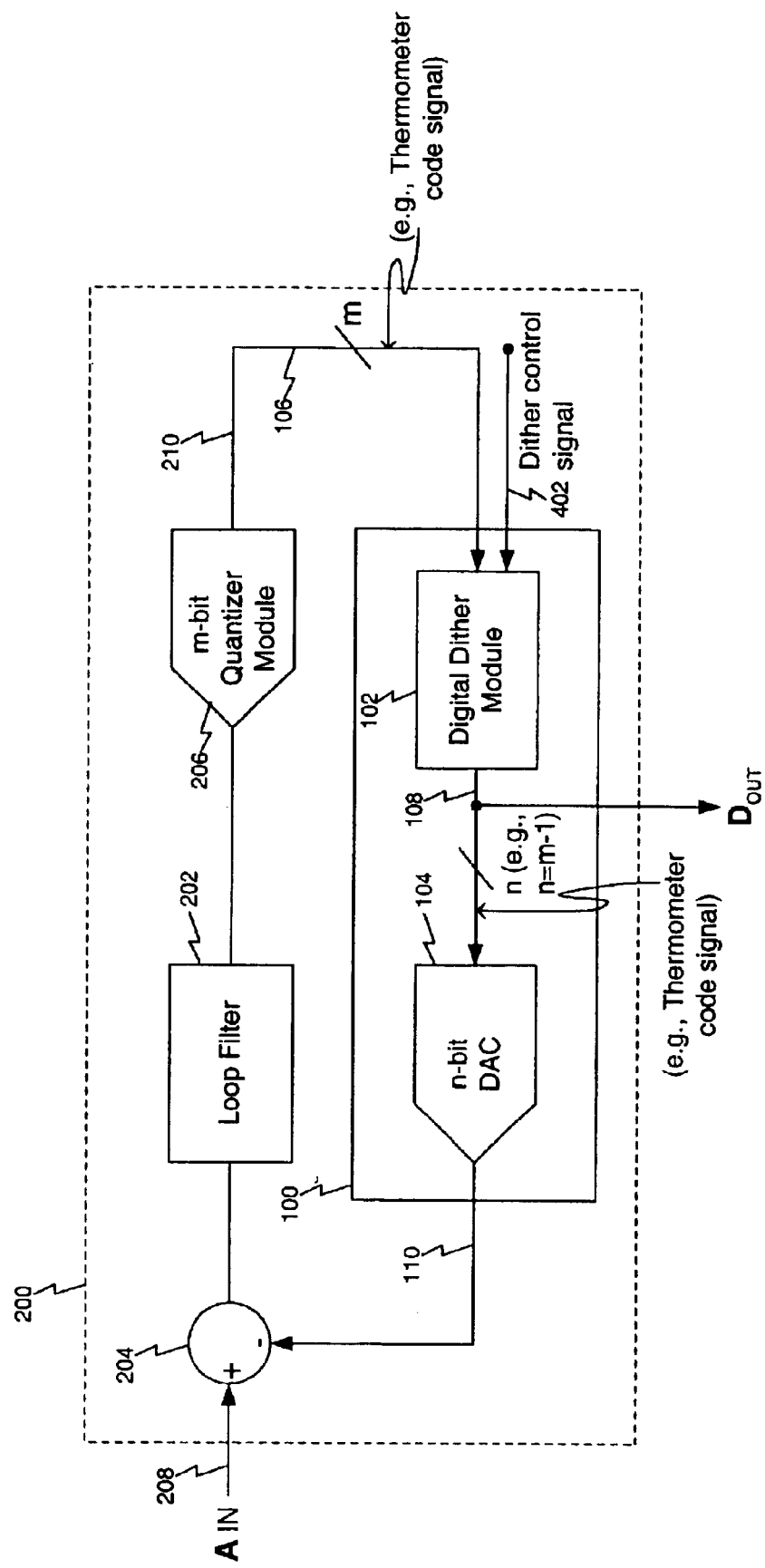
FIG. 4 is a block diagram of another example embodiment of the m-level delta-sigma modulator illustrated in FIG. 2, wherein n equals m-1.
Figure 6:
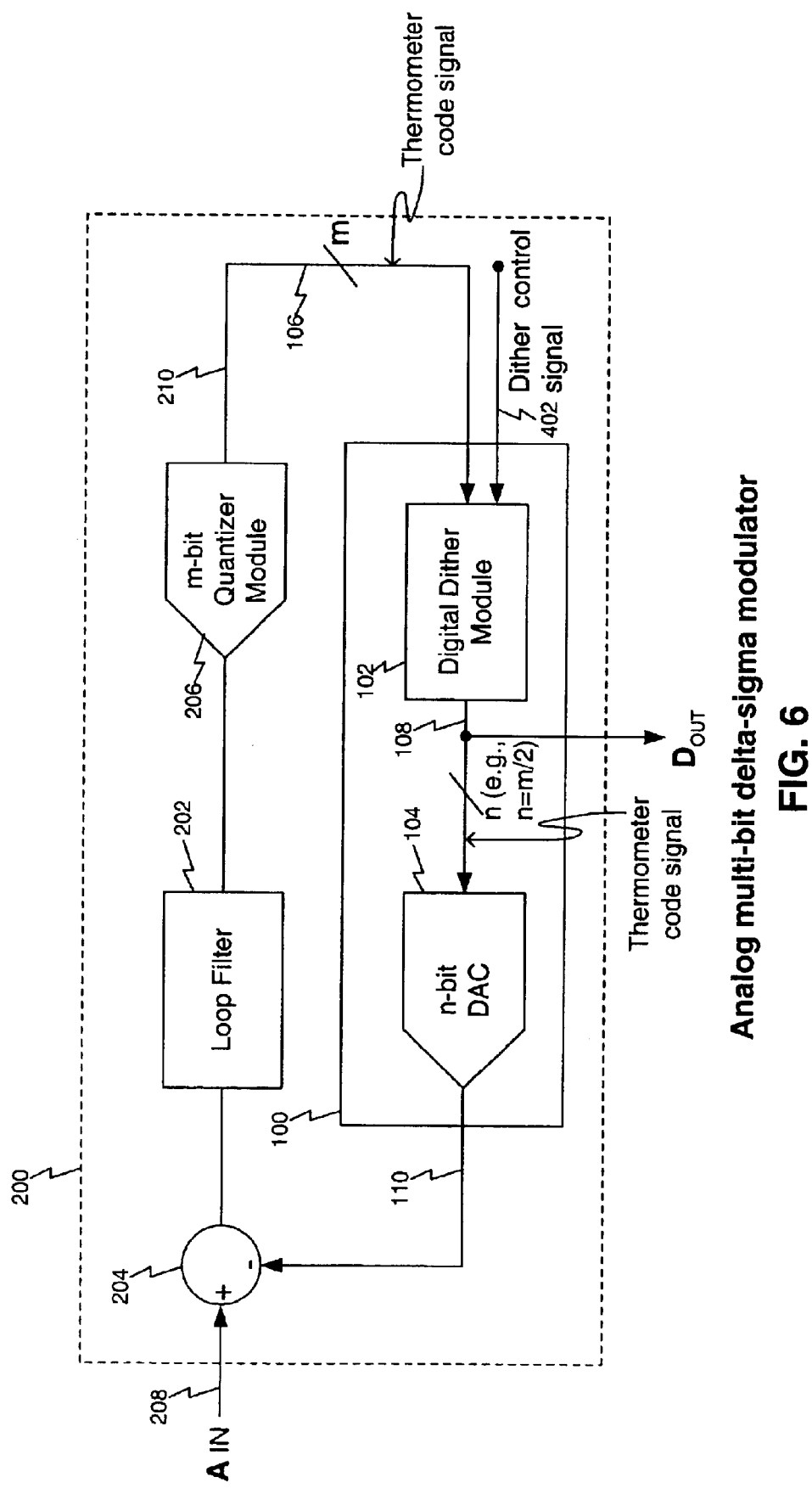
FIG. 6 is a block diagram of an example embodiment of the m-level delta-sigma modulator illustrated in FIG. 2, wherein n equals m/2.

The delta-sigma modulator 200 can be implemented for m greater than n and/or for m less than n. Where m is greater than n, the dithered digital feedback signal 108 is typically generated by selecting between sub-sets of the m-bit digital feedback signal 106. Alternatively, where n is greater than m, the dithered digital feedback signal 108 may be generated, for example, by directly adding a pseudo-random digital dither signal to the m-bit digital feedback signal 106. FIGS. 4 and 6 illustrate example implementations for m greater than n, wherein one of two sub-sets of m-bits of the digital feedback signal 106 are selected as the dithered digital feedback signal 108. Other embodiments select from more than two sub-sets of the m-bits.

FIG. 4 illustrates an example embodiment of the delta-sigma modulator 200, wherein n=m−1. In this example, the digital feedback signal 106 is an m-bit thermometer-ode, including bits 0 through m−1, the dithered digital feedback signal 108 is an n-bit thermometer-code, and the digital dither module 102 receives or internally generates a dither control signal 402 that controls selection of sub-sets of the m-bit digital feedback signal 204.

In an embodiment, the digital dither module 102 selects between one of two sub-sets of bits from the m-bit digital feedback signal 106 to output as the dithered digital feedback signal 108. For example, in an embodiment, the digital dither module 102 selects between a sub-set A, including bits 0 through m−2, and a sub-set B, including bits 1 through m−1, wherein bit 0 is the least significant bit. In this embodiment, the dither control signal 402 needs only one bit having two states. In an embodiment, the dither control signal 402 is generated with a pseudo-random number generator. In an alternative embodiment, the dither control signal 402 cycles through, or alternates among the possible range of values (e.g., 0 and 1).

Figure 5:
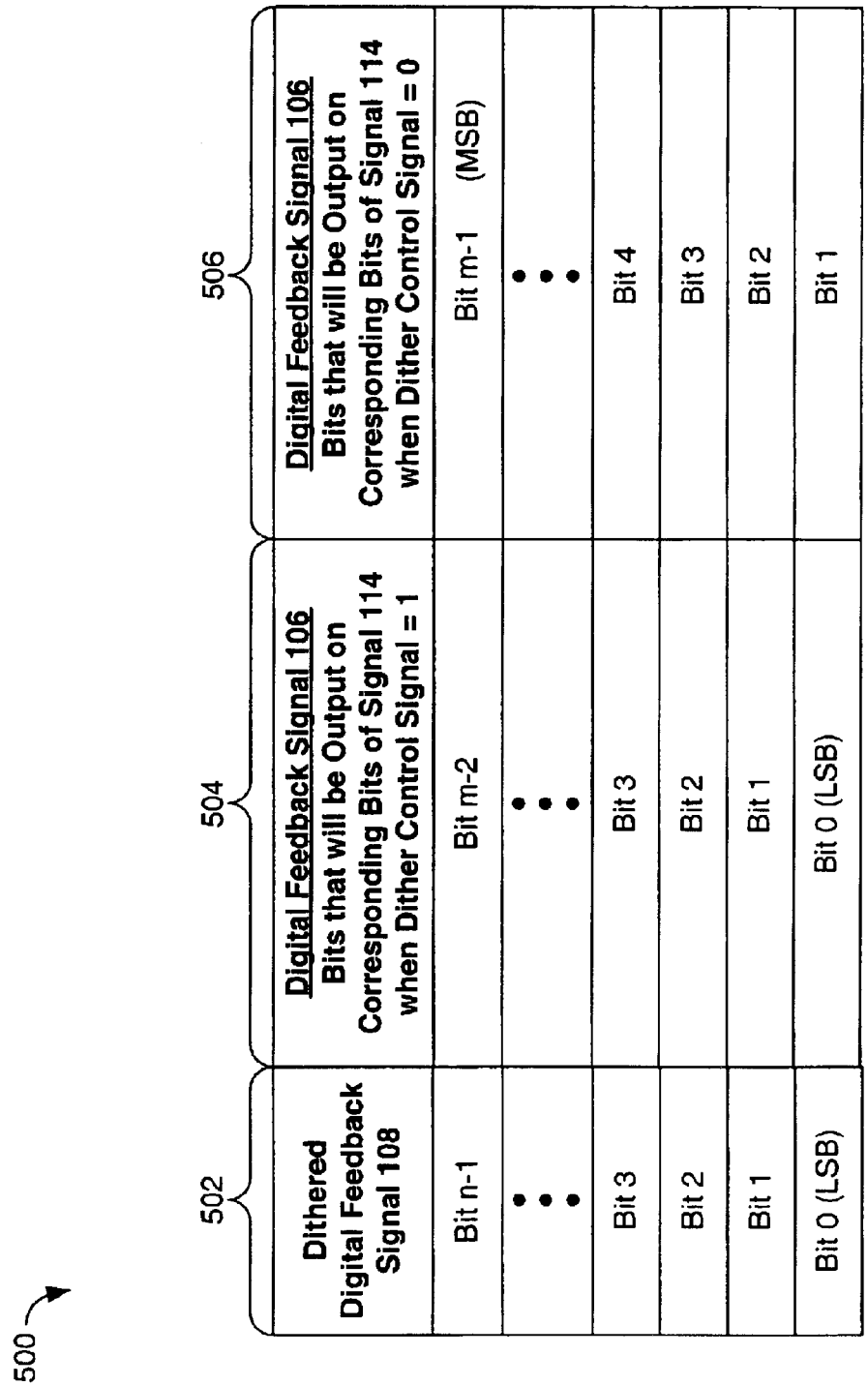
FIG. 5 illustrates an example input/output table for the example embodiment of the m-level delta-sigma modulator illustrated in FIG. 4

FIG. 5 illustrates an example input/output table 500 for the example embodiment of FIG. 4. Column 502 lists the n bits of the dithered digital feedback signal 108. Column 504 lists the corresponding bits of the m-bit digital feedback signal 106 that will be output by the digital dither module 102 when the dither control signal 402 is at a first state (e.g., one). Column 506 lists the corresponding bits of the m-bit digital feedback signal 106 that will be output by the digital dither module 102 when the dithered control signal 402 is at a second state (e.g., zero). In other words, column 504 represents a sub-set A, and column 506 represents a sub-set B, one of which is selected based on dither control signal 402. The dither control signal 402 controls whether the n-bit digital dither feedback signal 108 is generated from bits 0 through m−2 or from bits 1 through m−1, of the m-bit digital feedback signal 106.

FIG. 6 illustrates an example implementation of the delta-sigma modulator 200, wherein n=m/2. In alternative embodiments, n equals m divided by other integers. In the example of FIG. 6, the m-bit digital feedback signal 106 is an m-bit thermometer-code, and the dithered digital feedback signal 108 is an n-bit thermometer-code. The digital dither module 102 selects between subsets of the m-bits of the m-bit digital feedback signal 106 to output as the n-bit dithered digital feedback signal 108. In an embodiment, the dither control signal 402 is generated with a pseudo-random number generator. In an alternative embodiment, the dither control signal 402 cycles through, or alternates among the possible range of values (e.g., 0 and 1).

Figure 7:
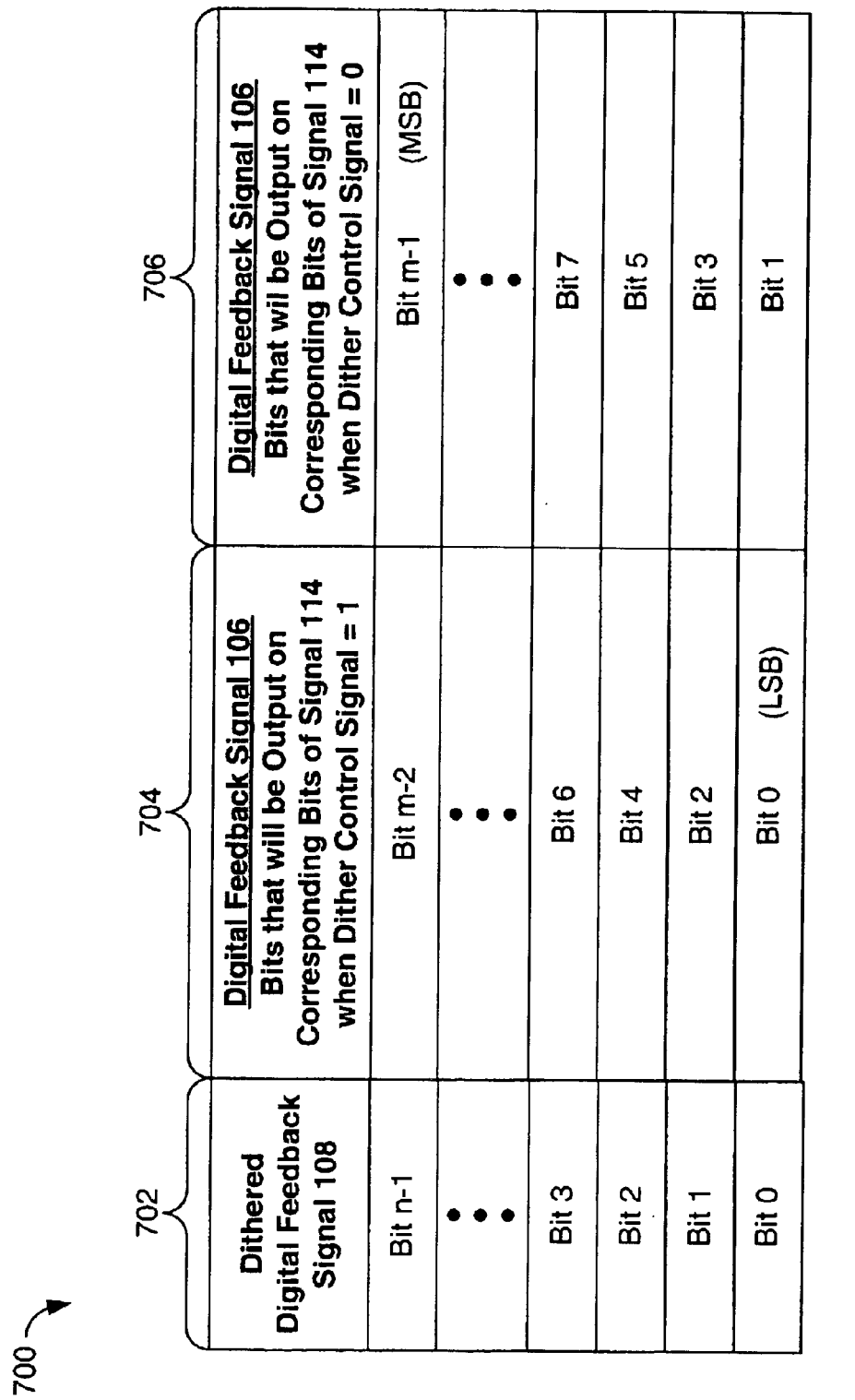
FIG. 7 illustrates an example input/output table for the example embodiment of the m-level delta-sigma modulator illustrated in FIG. 6.

FIG. 7 illustrates an example input/output table 700 for the example implementation of FIG. 6. Column 702 lists the n bits of the dithered digital feedback signal 108. Column 704 lists the corresponding bits of the m-bit digital feedback signal 106 that will be output by the digital dither module 102 when the dither control signal 402 is at a first state (e.g., one). Column 706 lists the corresponding bits of the m-bit digital feedback signal 106 that will be output by the digital dither module 102 when the dither control signal 402 is at a second state (e.g., zero). The dither control signal 402 controls whether the digital dither module 102 selects bits 0, 2, 4, ..., m−2 (i.e., even bits), or bits 1, 3, 5, ..., m−1 (i.e., odd bits), of the m-bit digital feedback signal 106, to output as the dithered digital feedback signal 108.

Figure 8:
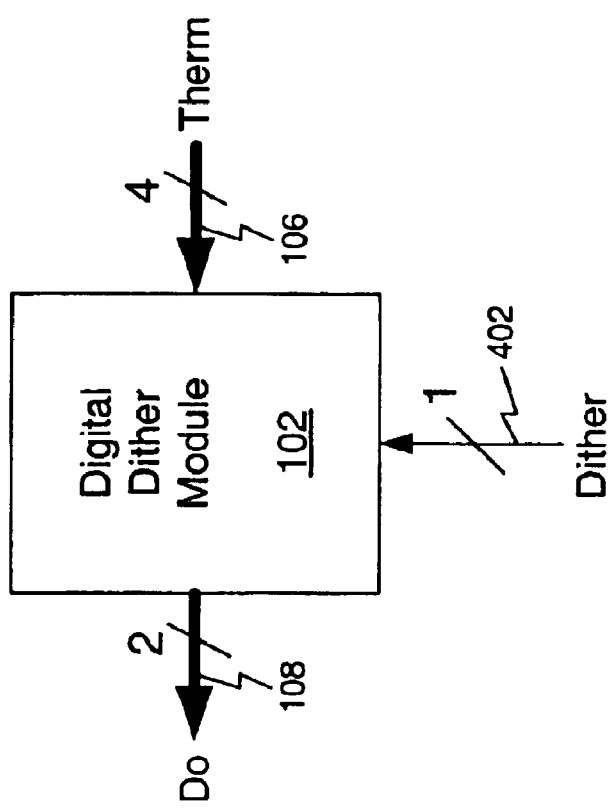
FIG. 8 is a block diagram of an example embodiment of the digital dither module illustrated in FIG. 6.
Figure 9:
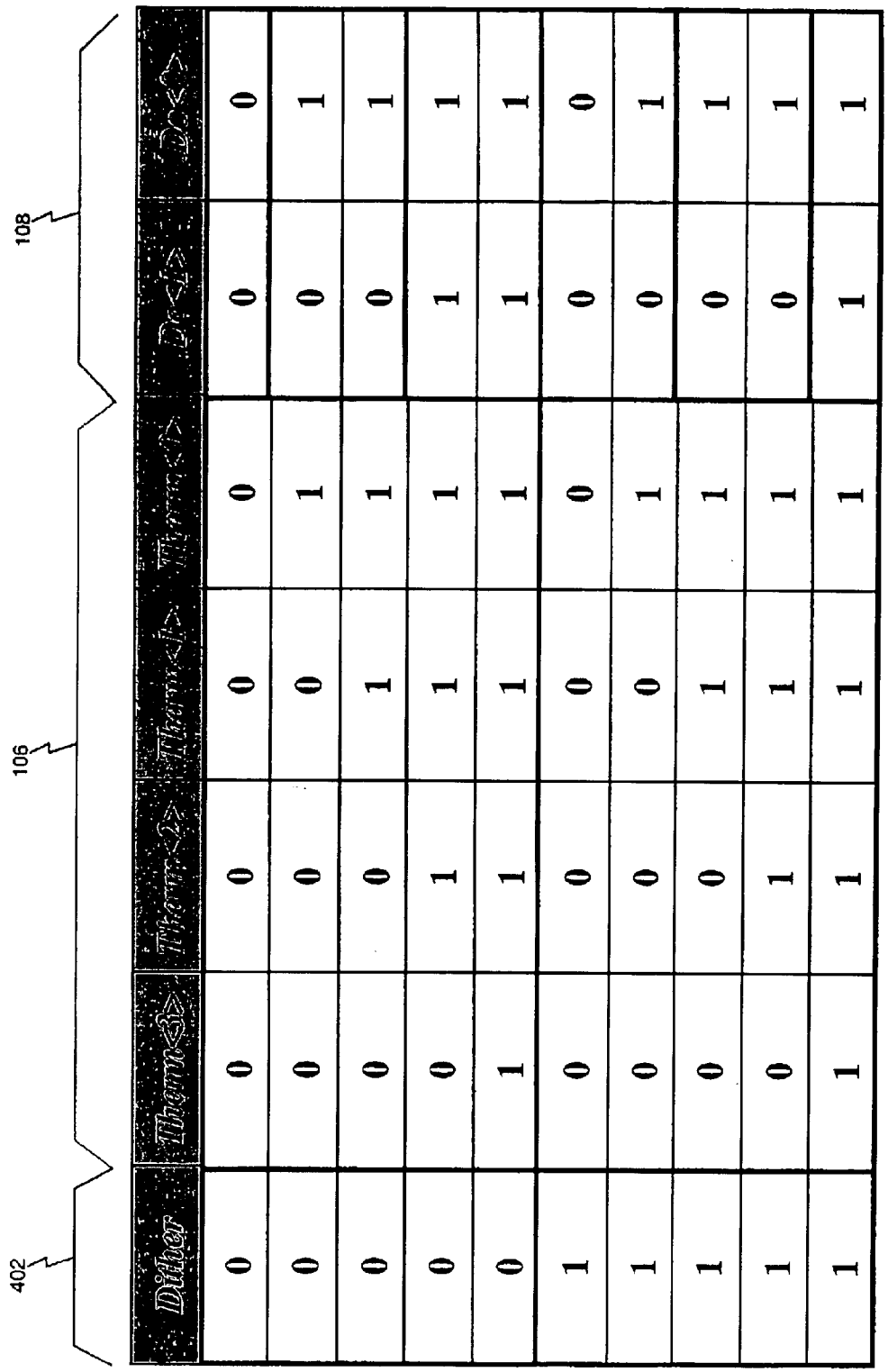
FIG. 9 illustrates example a truth table for the example of FIG. 8.
Figure 10:
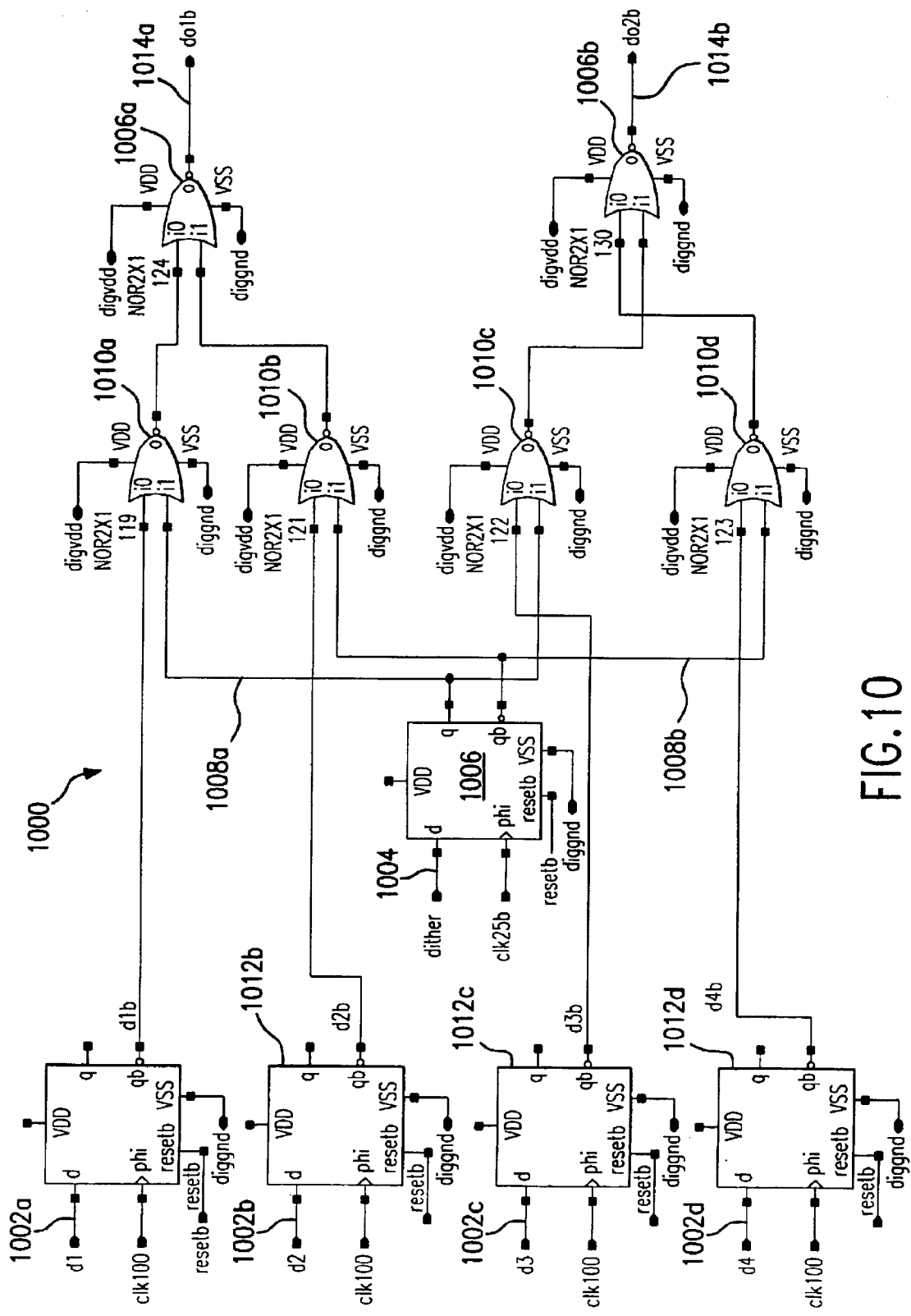
FIG. 10 illustrates an example circuit diagram for the digital dither module illustrated in FIG. 8.

FIG. 8 illustrates a block diagram of an example implementation of the digital dither module 102, in accordance with the example of FIG. 6, wherein m equals four and n equals two. FIG. 9 illustrates a truth table for the example of FIG. 8. FIG. 10 illustrates an example circuit diagram for the example digital dither module 1000, which is an example implementation of the digital dither module 102 illustrated in FIG. 8.

In FIG. 10, the digital dither module 1000 receives a four bit thermometer code 1002*a–d* from the quantizer module 206, illustrated in FIG. 6. The four bit code 1002*a–d* corresponds to Therm <0> through Therm <3> of the m-bit digital feedback signal 106, illustrated in FIG. 9. In an embodiment, the quantizer module 206 is implemented with a 2-bit flash ADC including 4 comparators, which outputs the 4-bit thermometer-code 1002*a–d* illustrated in FIG. 10. The four bits of the thermometer-code 1002*a–d* are provided to OR gates 1010*a–d*, respectively, through D-type flip-flops 1012*a* through 1012*d*.

The digital dither module 1000 also receives a single-bit digital dither control signal 1004. In an embodiment, the single-bit digital dither control signal 1004 is generated by a pseudo-random number generator. The digital dither control signal 1004 is input to a D-type flip-flop 1006, which outputs dither control signals 1008*a* and 1008*b*, which are the compliment of one another (i.e., when one is high, the other is low). The dither control signals 1008*a* and 1008*b* are provided to the OR gates 1010*a*–*d* as illustrated.

The outputs of the OR gates 1010*a*–*d* are provided to the OR gates 1006*a* and 1006*b*, which output a 2-bit thermometer code signal 1014, analogous to the dithered digital feedback signal 108.

In operation, bit 1002*a* of the thermometer code input signal is the least significant bit ("LSB") and bit 1002*d* is the most significant bit ("MSB"). Depending on the state of the dither control signal 1004, the digital dither circuit 1000 passes either bits 1002*a* and 1002*c*, or bits 1002*b* and 1002*d*, as the 2-bit thermometer code signal 1014, as illustrated in FIG. 9.

In an embodiment, the 2-bit thermometer code signal 1014 (i.e., the dithered digital feedback signal 108), is further processed before and/or after m-bit DAC 104. For example, in an embodiment, the 2-bit thermometer code signal 1014 is processed in a dynamic element mismatch circuit. Mismatch shaping circuitry shapes the mismatches in the analog elements to substantially reduce errors in the signal band of an over sampling converter.

Methods and systems for dynamic mismatch shaping are described in the following co-pending and commonly owned U.S. applications, all of which are incorporated herein by reference in their entireties:

Ser. No. 09/949,807 titled "Method and Apparatus for Mismatched Shaping of An Oversampled Converter," filed on Sep. 11, 2001; and Ser. No. 09/949,815, titled "Method and Apparatus for Mismatched Shaping of An Oversaanpled Converter," filed on Sep. 11, 2001.

Mismatch shaping is also taught in one or more of the following U.S. patents, all of which are incorporated herein by reference in their entireties:

U.S. Pat. No. 5,404,142 (Adams et al.), titled "Data-Directed Scrambler For Multi-Bit Noise Shaping D/A Converters;"

U.S. Pat. No. 5,406,283 (Leung), titled "Multi-bit Oversampled DAC with Dynamic Element Matching;" and U.S. Pat. No. 5,684,482 (Galton), titled "Spectral Shaping of Circuit Errors In Digital-to-Analog Converters."

Figure 15A:
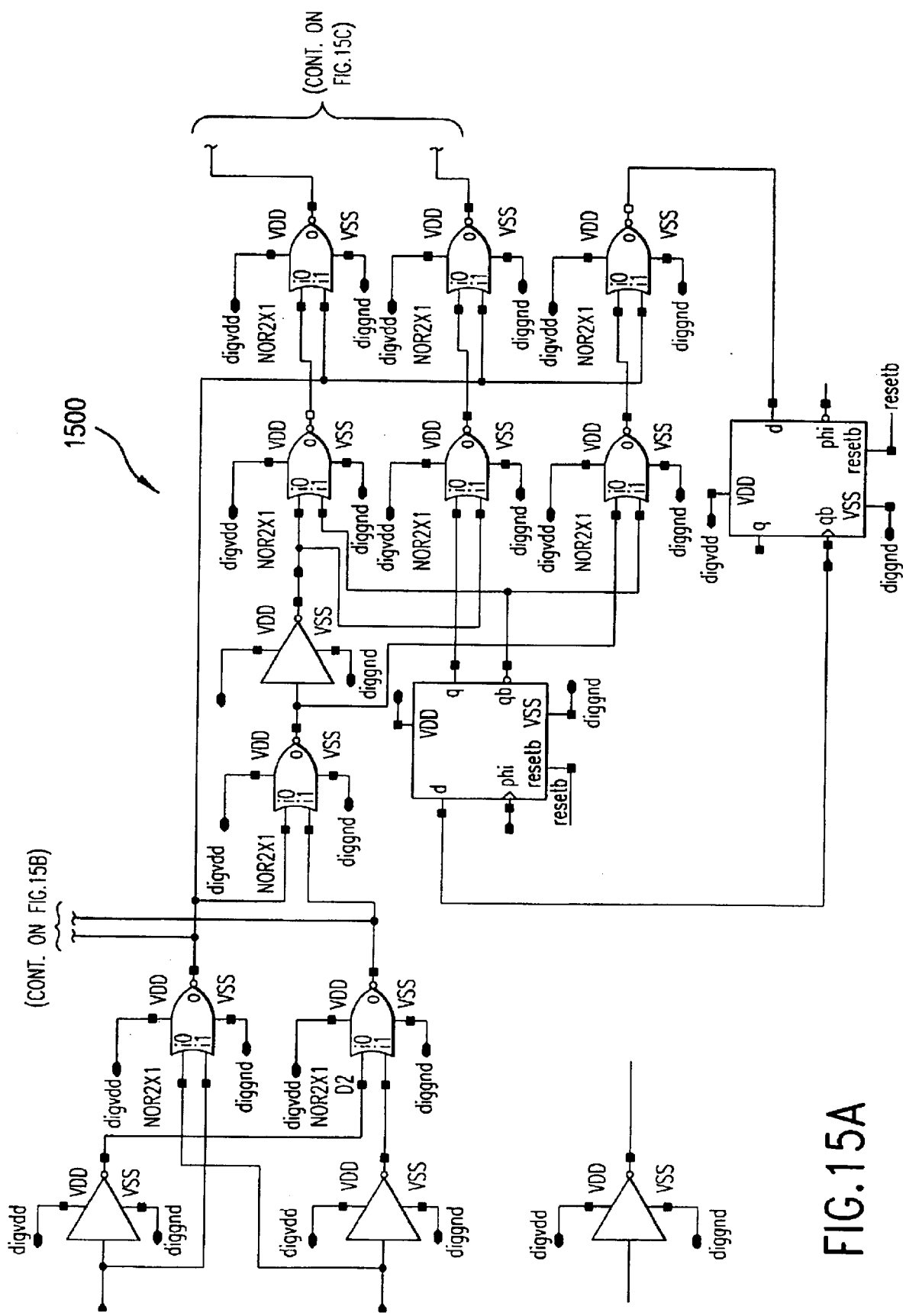
FIGS. 15A, B, and C illustrate an example dynamic element mismatch circuit that processes a digital dither signal, in accordance with an aspect of the present invention.
Figure 15B:
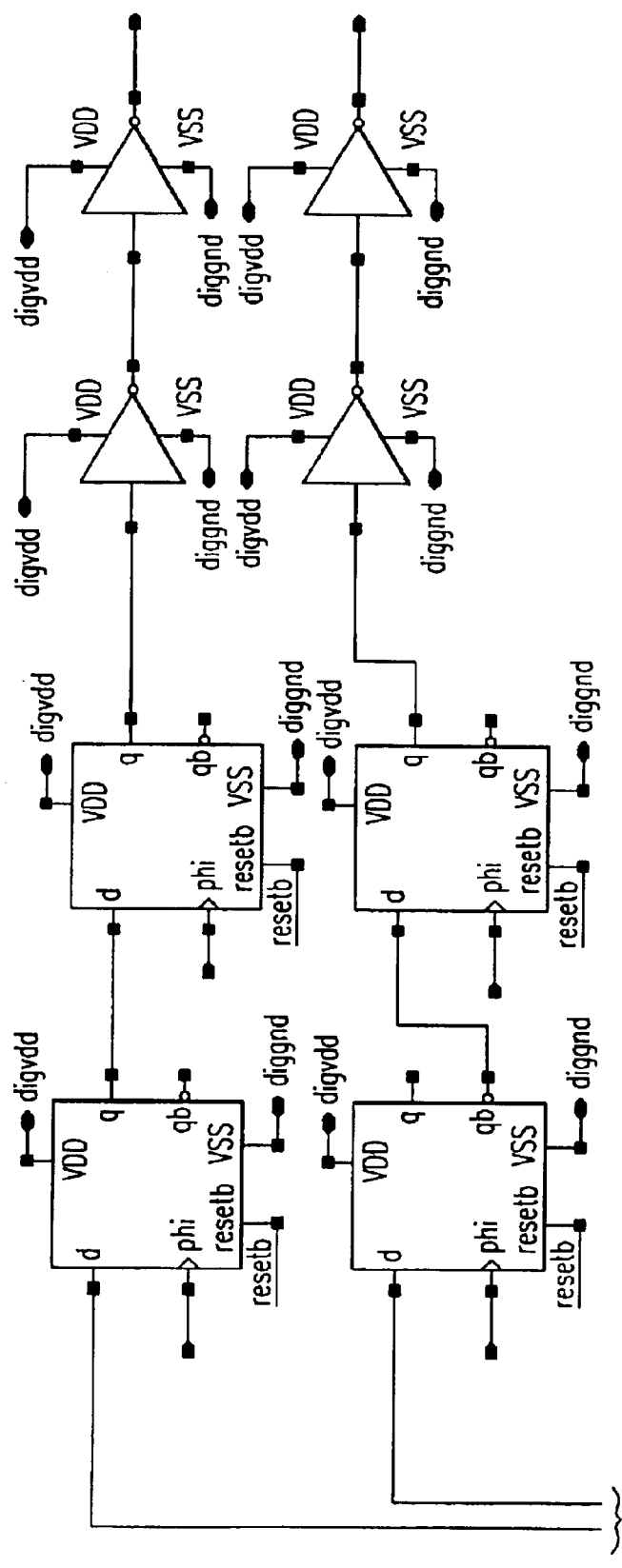
Figure 15C:
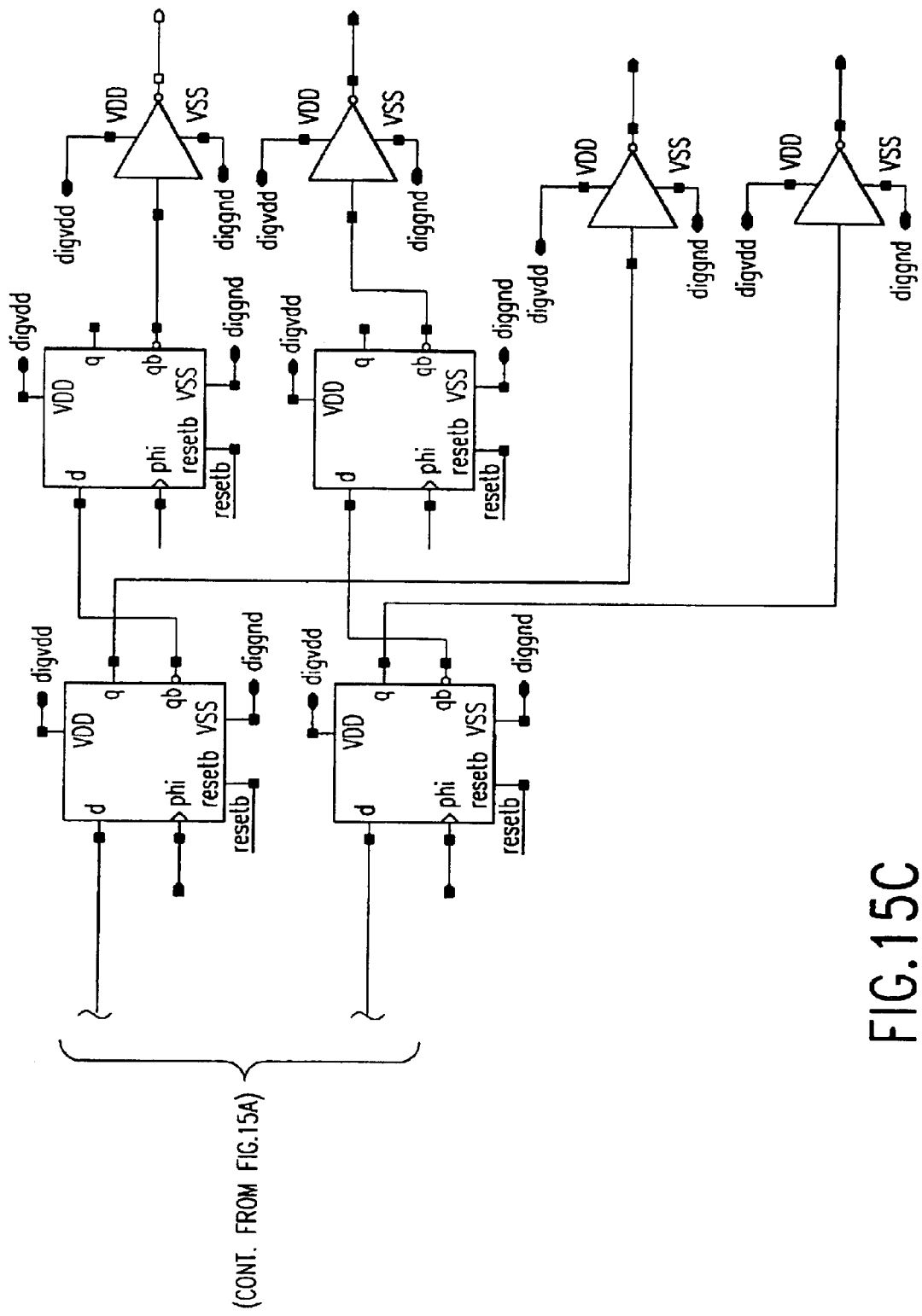

FIGS. 15A, B, and C illustrate an example dynamic element mismatch circuit 1500 that scrambles the 2-bit thermometer code signal 1014 and provides first-order noise shaping of element mismatch errors in the 3-level feedback signal before m-bit ADC 104. Based on the description herein, one skilled in the relevant art(s) will understand that other signal processing techniques can be performed on the 2-bit thermometer code signal 1014 (i.e., the dithered digital feedback signal 108) as well.

Figure 11A:
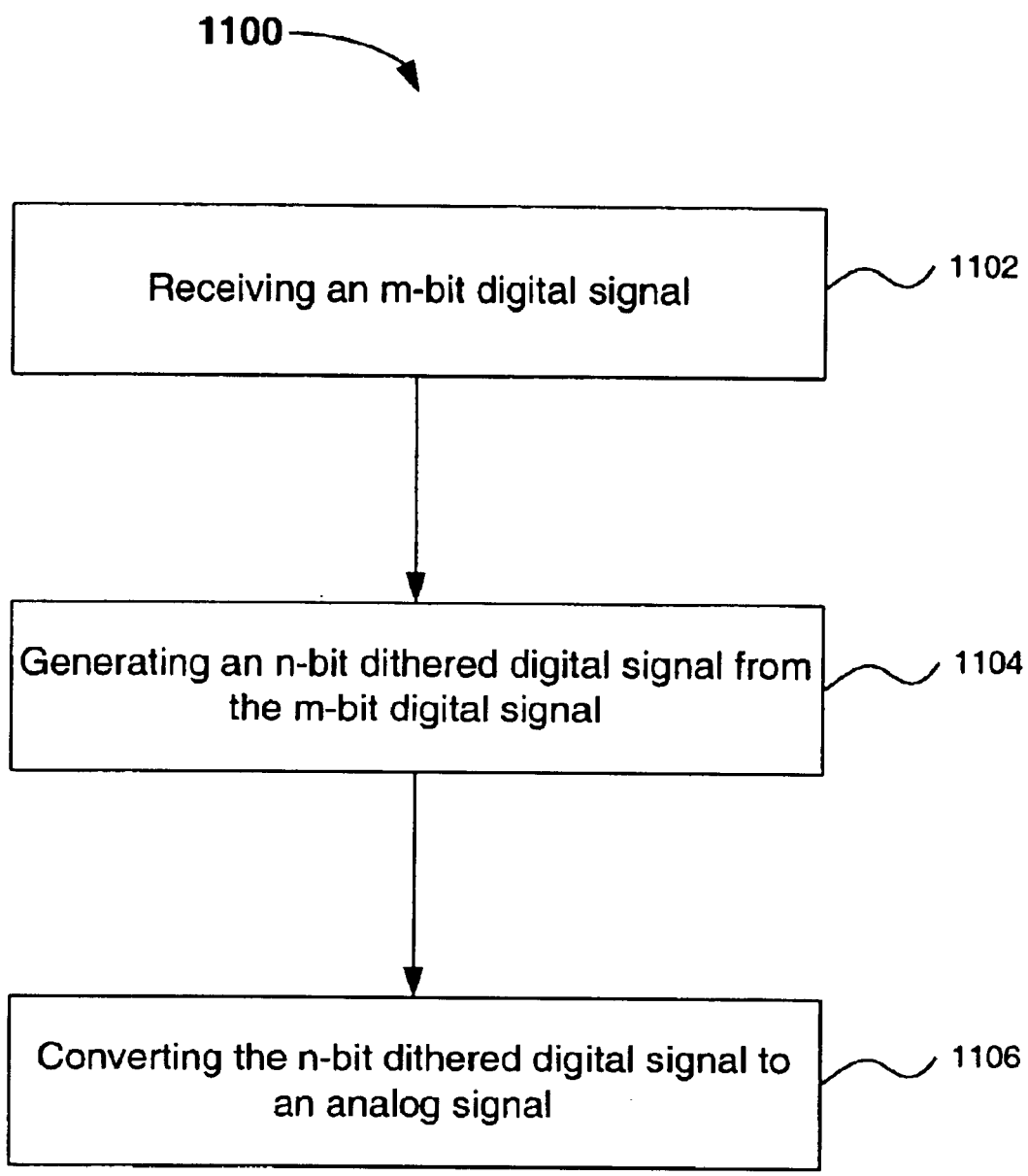
FIG. 11A is a process flowchart illustrating a method for dithering a digital signal in accordance with the present invention.

FIG. 11A is a process flowchart 1100 illustrating a method for dithering a digital signal. Operation of the process flowchart 1100 is described with reference to the dither DAC 100, illustrated in FIG. 1. The process begins with step 1102, receiving an m-bit digital signal, such as the digital signal 106 in FIG. 1. Step 1104 includes generating an n-bit dithered digital signal from the m-bit digital signal. In the dither DAC 100, step 1104 is performed by the digital dither module 102. Step 1106 includes converting the n-bit dithered digital signal to an analog signal. In FIG. 1, this is performed by the DAC 104.

Figure 11B:
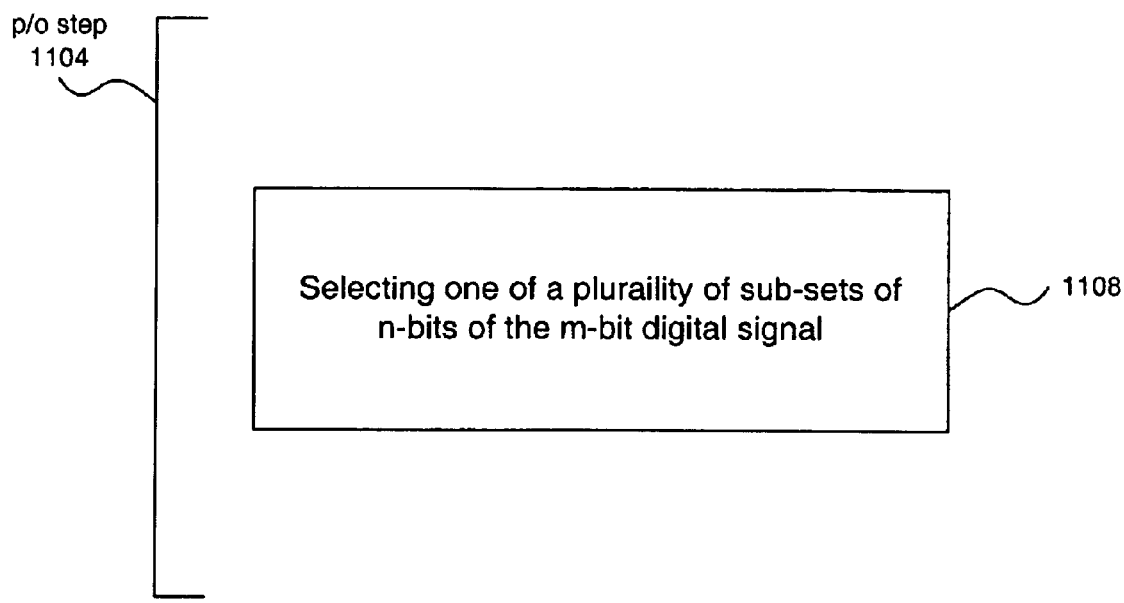
FIG. 11B illustrates an example implementation of a portion of the process flowchart illustrated in FIG. 11A.

FIG. 11B illustrates an example wherein step 1104 includes a step 1108 of selecting one of a plurality of sub-sets of n-bits of the m-bit digital signal, to output as the n-bit dithered digital signal.

Figure 11C:
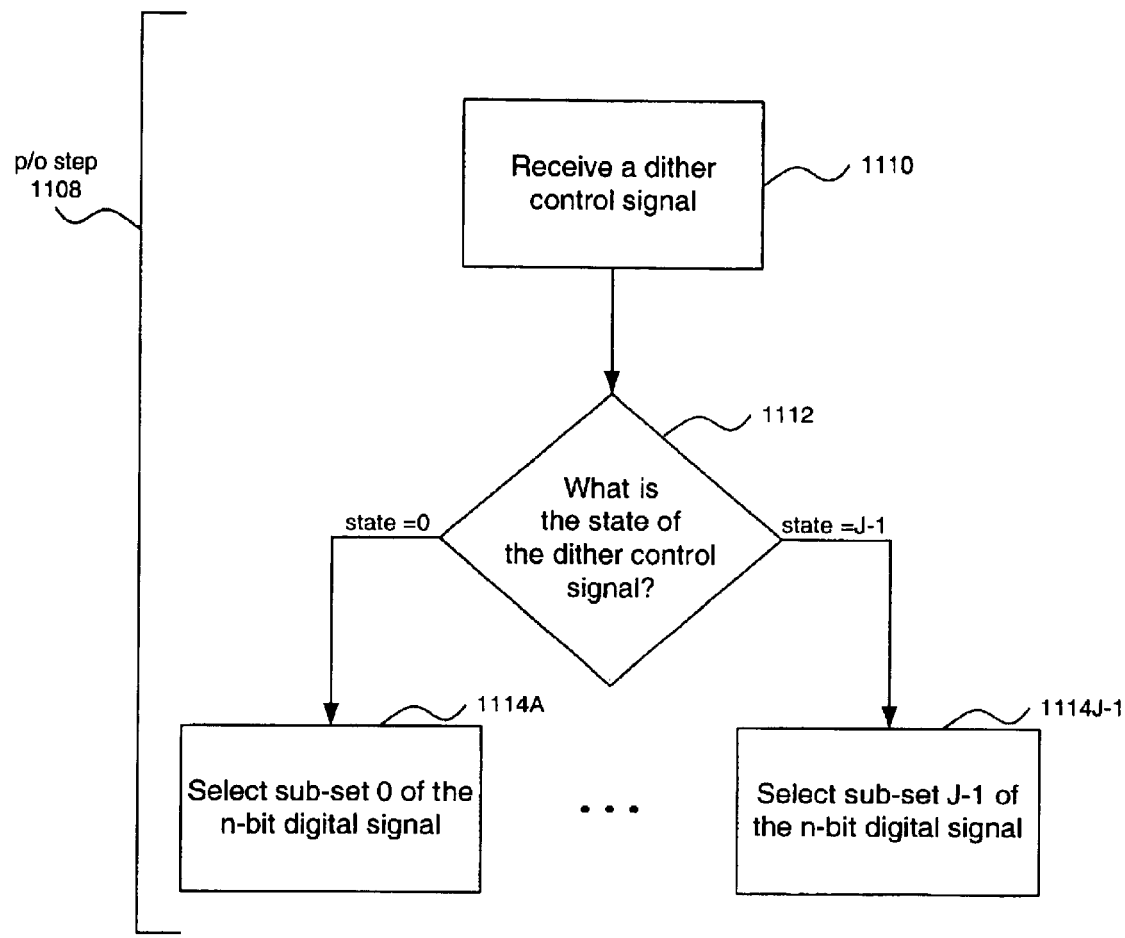
FIG. 11C illustrates an example implementation of the portion of the process flowchart illustrated in FIG. 11B.

FIG. 11C illustrates an example wherein step 1108 includes steps 1110 through 1114. Step 1110 includes receiving a dither control signal, such as the dither control signal 402, illustrated in FIG. 4. Step 1112 determines a state of the dither control signal. In this example, the dither control signal has j possible states, illustrated as states 0 through j−1. Similarly, the m-bit digital signal (e.g., digital signal 106), includes sub-sets 0 through j−1. In an embodiment, the sub-sets 0 through j−1 are exclusive of one another. Alternatively, two or more of the sub-sets 0 through j−1 overlap one another.

Depending upon the state of the dither control signal, processing proceeds to one of steps $1114_0$ through $1114_{j-1}$. For example, when the dither control signal is at state 0, processing proceeds to step $1114_0$, selecting sub-set 0 of the m-bit digital signal, to output as the n-bit dithered digital signal.

Figure 11D:
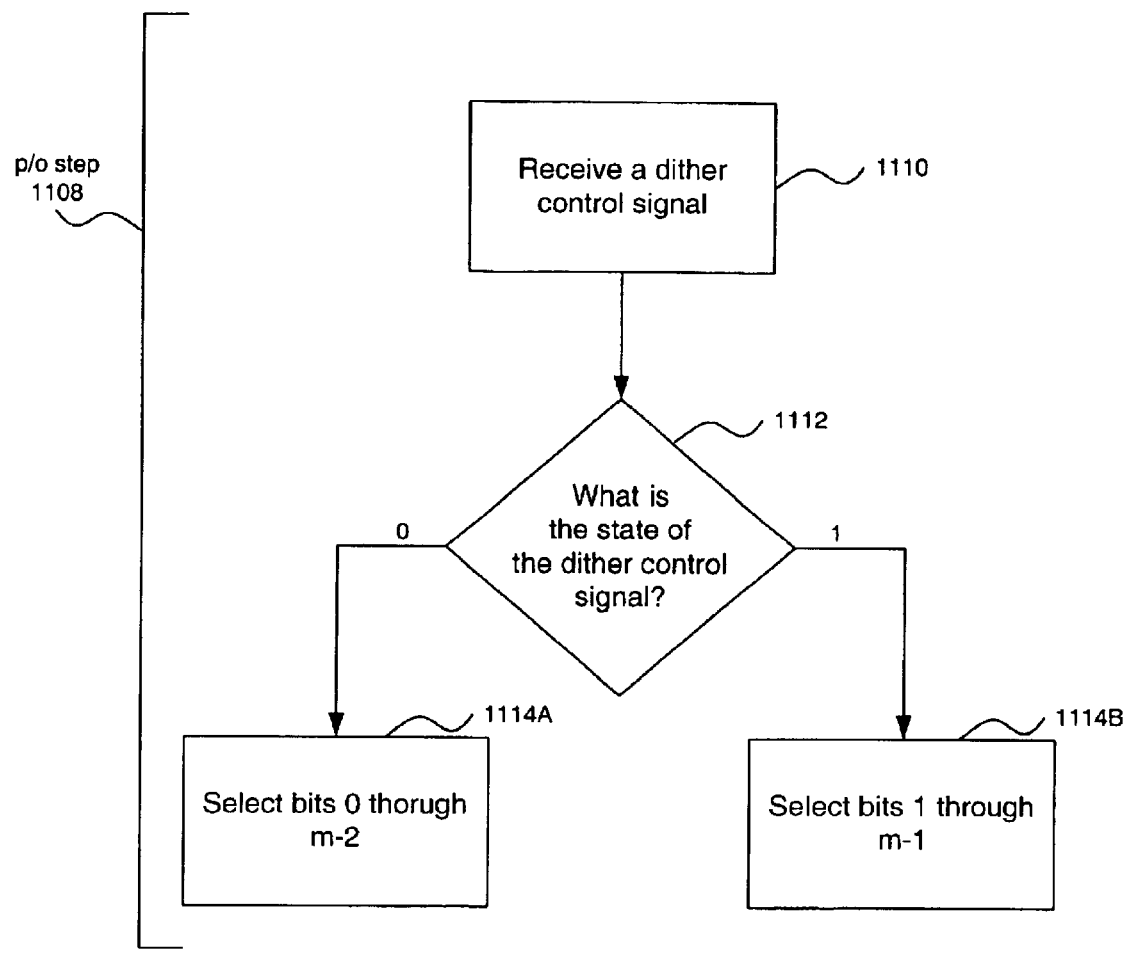
FIG. 11D illustrates an example implementation of the portion of the process flowchart illustrated in FIG. 11C.
Figure 11E:
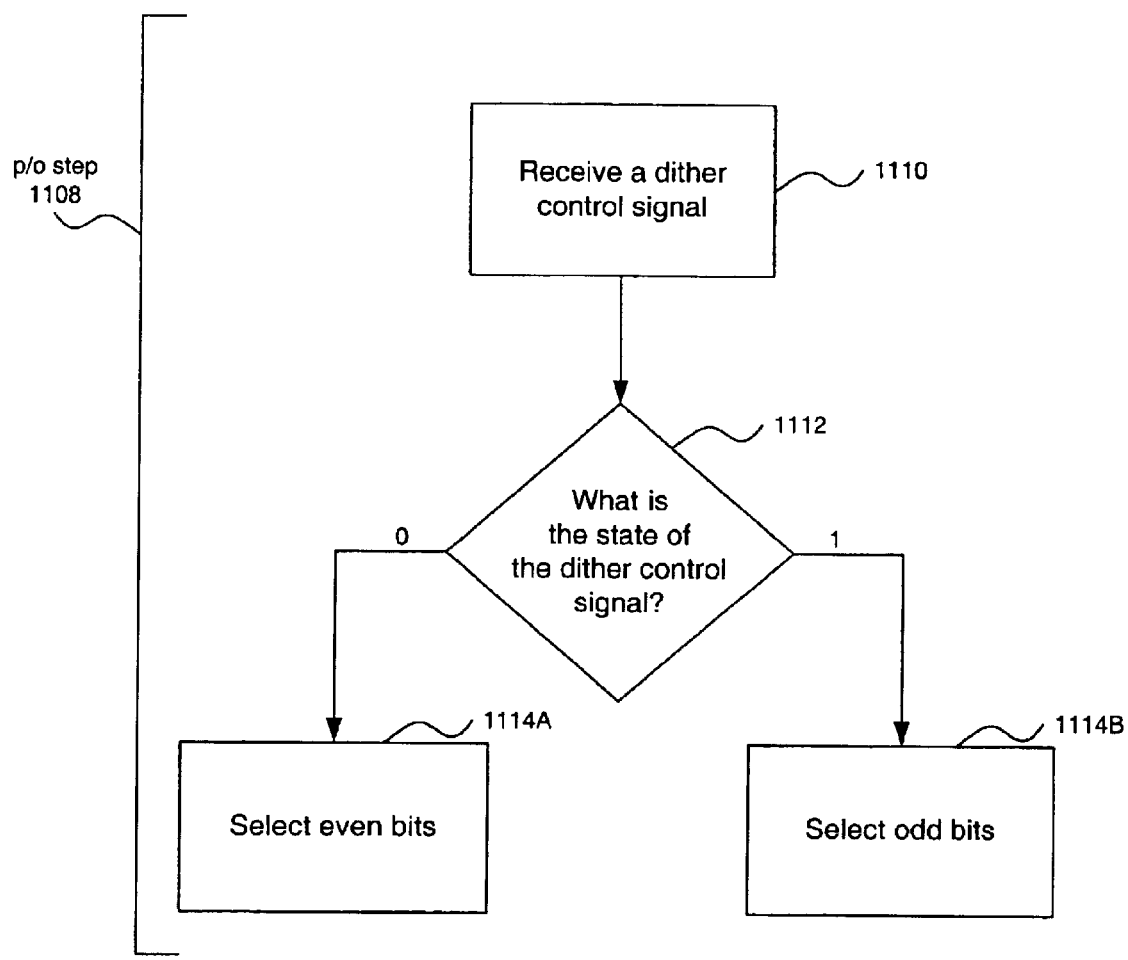
FIG. 11E illustrates another example implementation of the portion of the process flowchart illustrated in FIG. 11C.

FIG. 11D illustrates an example wherein the digital signal 106 includes two overlapping sub-sets, bits 0 through m−2 and bits 1 through m−1. FIG. 11E illustrates an example wherein the digital signal 106 includes two non-overlapping sub-sets of even and odd bits.

Figure 12:
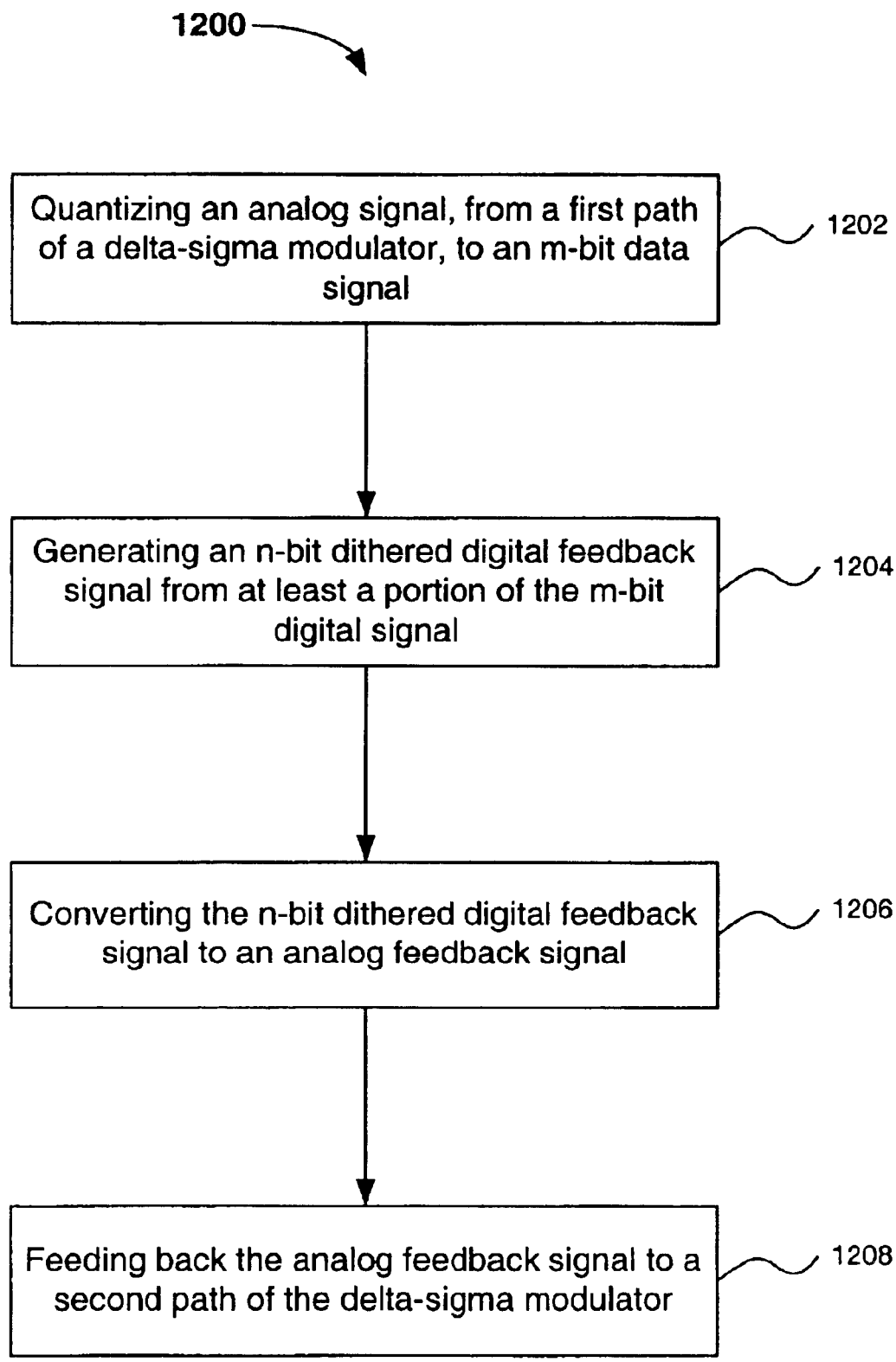
FIG. 12 is a process flowchart illustrating a method for implementing the invention in a delta-sigma modulator, in accordance with the present invention.

FIG. 12 is a process flowchart 1200 illustrating a method for implementing the invention in a delta-sigma modulator. The process flowchart 1200 is described with reference to the delta-sigma modulator 200, as illustrated in one or more of the drawing figures herein. The invention is not, however, limited to the implementation in delta-sigma modulators. Based on the description herein, one skilled in the relevant art(s) will understand that the invention can be implemented in other systems as well.

The process begins with step 1202, quantizing an analog signal, taken from a first path of a delta-sigma modulator, to an m-bit digital signal. Step 1204 includes generating an n-bit dithered digital feedback signal from at least a portion of the m-bit digital signal. Step 1266 includes converting the n-bit dithered digital feedback signal to an analog feedback signal. Step 1208 includes feeding back the analog feedback signal to a second path of the delta-sigma modulator. Step 1204 is substantially similar to step 1104, as described above.

Figure 13:
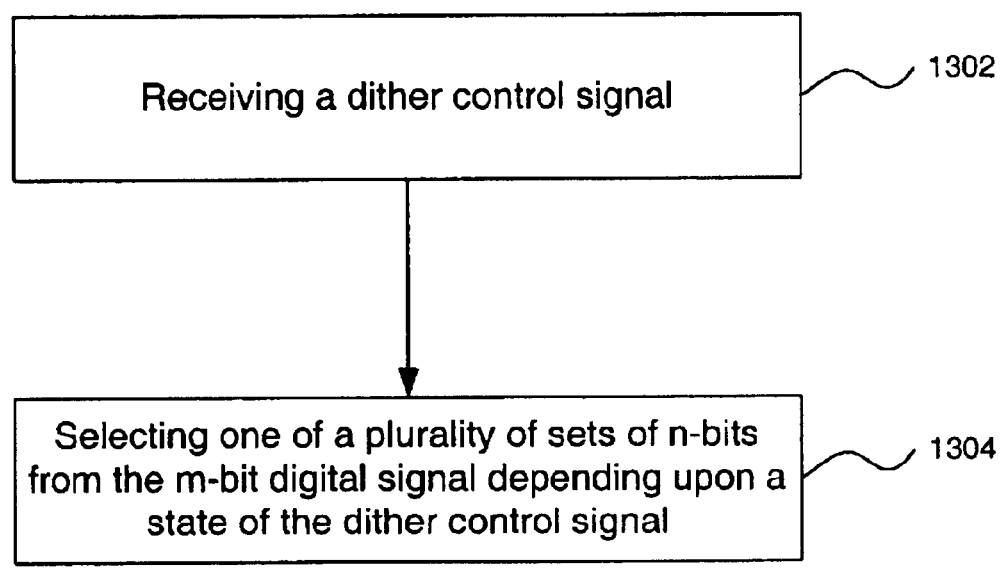
FIG. 13 is a process flowchart illustrating additional steps that can be performed as part of the flowcharts illustrated in FIG. 11 and FIG. 12.
Figure 14A:
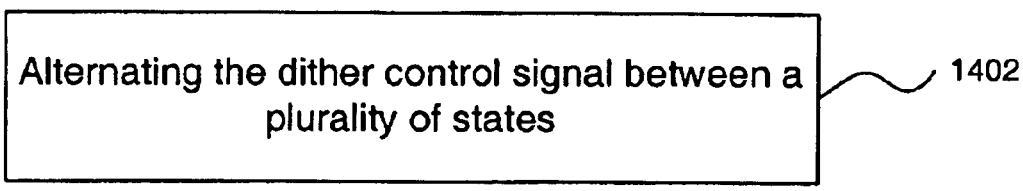
FIG. 14A illustrates an optional step that can be performed in the process flowchart illustrated in FIG. 13.
Figure 14B:
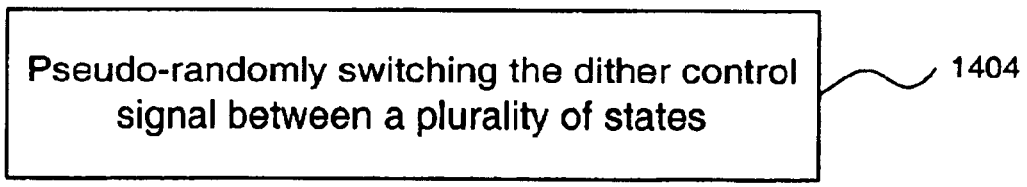
FIG. 14B illustrates another optional step that can be performed in the process flowchart illustrated in FIG. 13.

FIG. 13 is a process flowchart 1300 illustrating additional steps 1302 and 1304 that can be performed as part of step 1104 and/or step 1204. Step 1302 includes receiving a dither control signal. Step 1304 includes selecting one of a plurality of sets of n-bits from the m-bit digital signal, depending upon a state of the dither control signal. FIG. 14A illustrates an optional step 1402 of alternating the dither control signal between a plurality of states. FIG. 14B illustrates an optional step 1404 of pseudo-randomly switching the dither control signal between a plurality of states.

X. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be under-stood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of applying digital dither, comprising the steps of:
   (a) quantizing an analog signal to an m-bit digital signal;
   (b) generating an n-bit dithered digital feedback signal from at least a portion of the m-bit digital signal;
   (c) converting the n-bit dithered digital feedback signal to an analog feedback signal;
   (d) feeding back the analog feedback signal to a second path of the delta-sigma modulator; and
   (e) performing one or more feedback processes on at least one of the n-bit dithered digital feedback signal and the analog feedback signal.

2. The method of claim 1, wherein the one or more feedback processes comprises mismatch shaping.

3. The method of claim 1, wherein the one or more feedback processes comprises filtering.

4. The method of claim 1, wherein the one or more feedback processes comprises integration.

5. The method of claim 1, wherein the one or more feedback processes comprises selecting one or more feedback loops.

6. The method of claim 5, wherein the one or more feedback processes further comprises selecting one or more inputs to the one or more feedback loops.

7. The method of claim 5, wherein the one or more feedback processes further comprises selecting one or more outputs from said one or more feedback loops.

8. A delta-sigma modulator apparatus, comprising:
   (a) means for quantizing an analog signal to an m-bit digital signal;
   (b) means for generating an n-bit dithered digital feedback signal from at least a portion of the m-bit digital signal;
   (c) means for converting the n-bit dithered digital feedback signal to an analog feedback signal;
   (d) means for feeding back the analog feedback signal to a second path of the delta-sigma modulator; and
   (e) means for performing one or more feedback processes on at least one of the n-bit dithered digital feedback signal and the analog feedback signal.

9. The apparatus of claim 8, wherein the one or more feedback processes comprises mismatch shaping.

10. The apparatus of claim 8, wherein the one or more feedback processes comprises filtering.

11. The apparatus of claim 8, wherein the one or more feedback processes comprises integration.

12. The apparatus of claim 8, wherein the one or more feedback processes comprises selecting one or more feedback loops.

13. The apparatus of claim 12, wherein the one or more feedback processes further comprises selecting one or more inputs to the one or more feedback loops.

14. The apparatus of claim 12, wherein the one or more feedback processes further comprises selecting one or more outputs from the one or more feedback loops.

* * * * *